United States Patent [19]

Temple et al.

[11] Patent Number: 4,882,198
[45] Date of Patent: Nov. 21, 1989

[54] SYSTEM AND METHOD FOR VACUUM DEPOSITION OF THIN FILMS

[75] Inventors: Michael D. Temple; Richard I. Seddon, both of Santa Rosa; Kim L. Johnson, Carlsbad, all of Calif.

[73] Assignee: Optical Coating Laboratory, Inc., Santa Rosa, Calif.

[21] Appl. No.: 202,830

[22] Filed: Jun. 3, 1988

Related U.S. Application Data

[62] Division of Ser. No. 935,292, Nov. 26, 1986, Pat. No. 4,777,908.

[51] Int. Cl.$^4$ .......................... B05D 3/06; B05D 3/14; C23C 14/00
[52] U.S. Cl. ........................................ 427/38; 427/39; 427/47; 204/192.31
[58] Field of Search ...................... 204/192.31; 427/39, 427/38, 47

[56] References Cited

U.S. PATENT DOCUMENTS

| | | |
|---|---|---|
| 3,984,581 | 10/1976 | Dobler et al. |
| 4,361,114 | 11/1982 | Gurev |
| 4,448,802 | 5/1984 | Buhl et al. |
| 4,461,689 | 7/1984 | Diepers |
| 4,526,132 | 7/1985 | Ohta |
| 4,619,748 | 10/1986 | Moll et al. |
| 4,676,194 | 6/1987 | Satou et al. ............ 204/192.31 |
| 4,683,149 | 7/1987 | Suzuki et al. |
| 4,707,238 | 11/1987 | Okubo ............ 204/192.31 |

FOREIGN PATENT DOCUMENTS

| | | |
|---|---|---|
| 0064288 | 4/1982 | European Pat. Off. |
| 2624005 | 12/1977 | Fed. Rep. of Germany |
| 0135216 | 4/1979 | German Democratic Rep. ............ 204/192.31 |
| 140057 | 2/1980 | German Democratic Rep. |
| 0081790 | 7/1976 | Japan ............ 204/192.31 |
| 0100988 | 8/1979 | Japan ............ 204/192.31 |
| 0011127 | 1/1980 | Japan ............ 204/192.31 |

OTHER PUBLICATIONS

Bunshah et al., *Deposition Technologies for Films & Coatings*, (Noyes Publications, Park Ridge, N.J.), c.1982, pp. 102-104 and 244-260.
Pulker et al., "Optical and Mechanical Properties of Ion Plated Oxide Films", pp. 299-306.
Berry et al., "Thin Film Technology", Evaporated Films, 1979, pp. 139-142.

*Primary Examiner*—Norman Morgenstern
*Assistant Examiner*—Margaret Bueker
*Attorney, Agent, or Firm*—Philip A. Dalton

[57] ABSTRACT

A substrate holder is mounted within the vacuum chamber for carrying at least one substrate; an electrically conductive crucible is positioned within said vacuum chamber and is electrically insulated therefrom but has a low electrical resistance connection therebetween. The crucible is adapted to contain a preselected material for evaporation onto a substrate on the substrate holder. A high voltage electron beam source is positioned within said vacuum chamber in the vicinity of said crucible and includes a high voltage electron gun and a deflection magnet system arranged for bending electrons from said gun into said crucible for evaporating the preselected material therein, the magnet system forms a magnet field of prearranged characteristics in the region above said crucible. A low voltage, high current plasma source, including a separate plasma generating chamber is positioned relative to said vacuum chamber to produce an intense first plasma of a selected activation gas species in said plasma generating chamber for injection into said vacuum chamber. The plasma source is positioned at any convenient location relative to the crucible and the electron beam source and is electrically interconnected with the crucible for current flow therebetween. The plasma source fills the vacuum chamber with a generally distributed plasma. The distributed plasma coacts with the magnetic field above said crucible and evaporant material leaving the crucible to form an intense second plasma in the region above said crucible, thereby activating the evaporant material passing through the region toward the substrate to produce a vacuum deposited thin film having improved thin film characteristics.

10 Claims, 12 Drawing Sheets

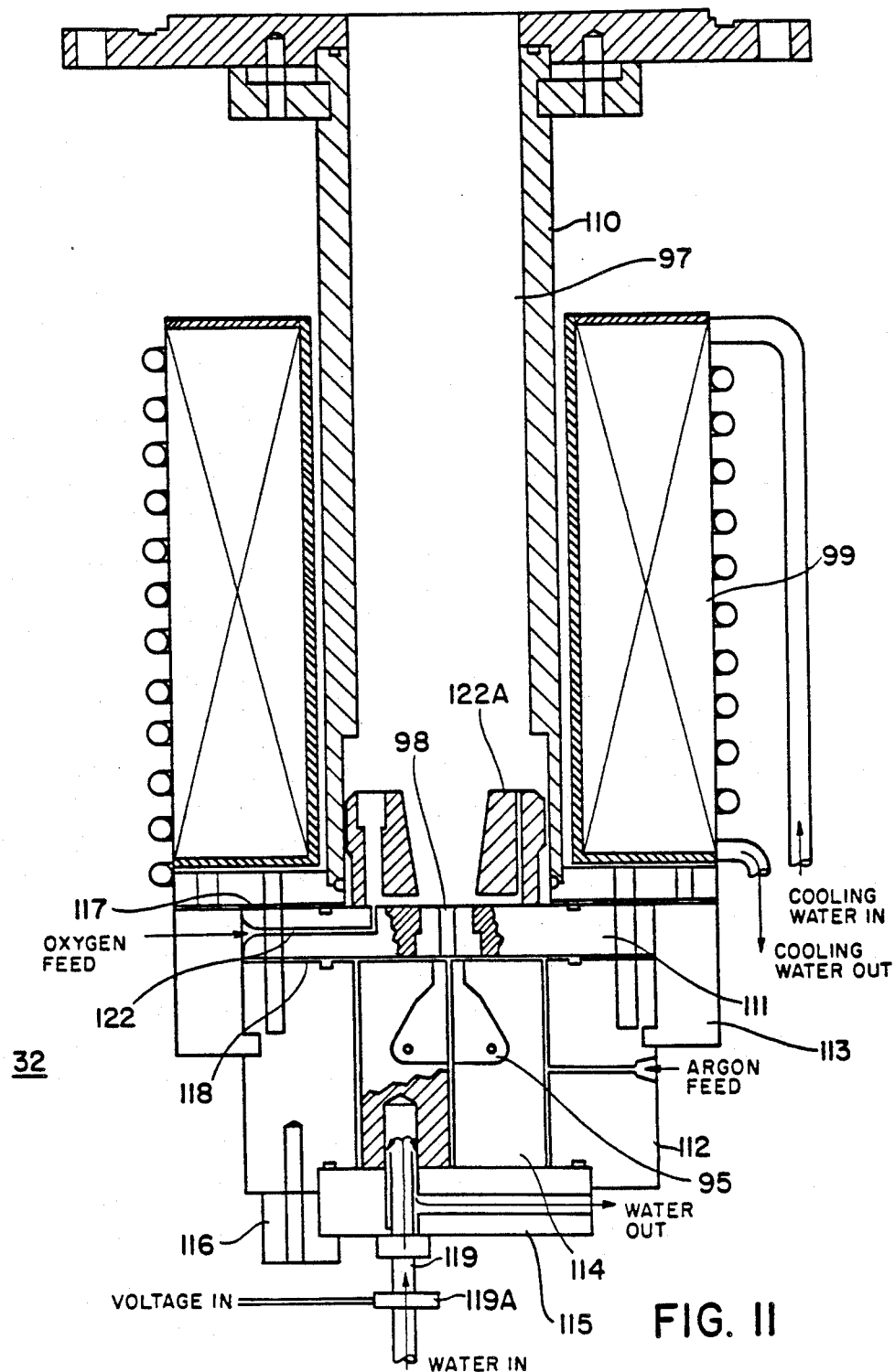

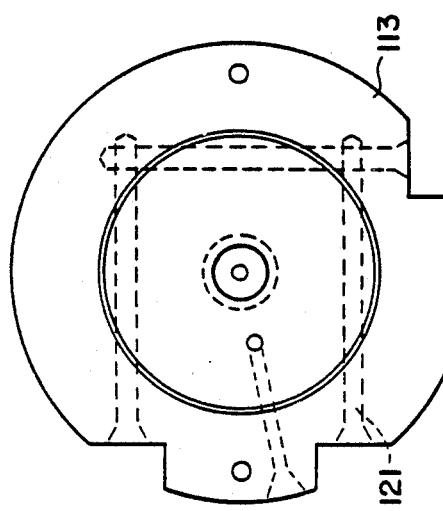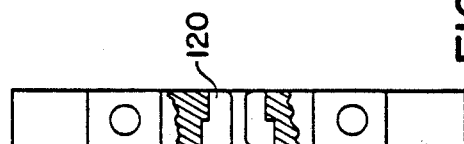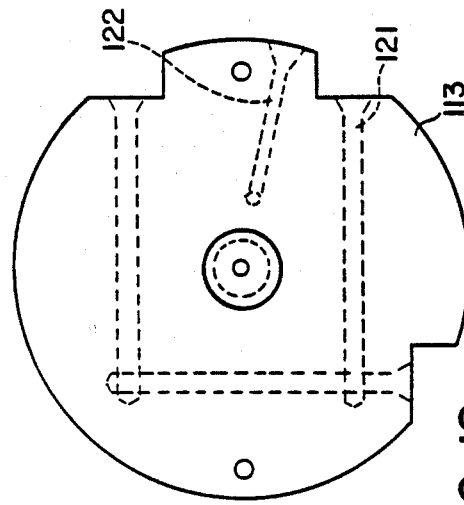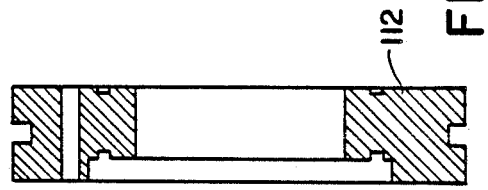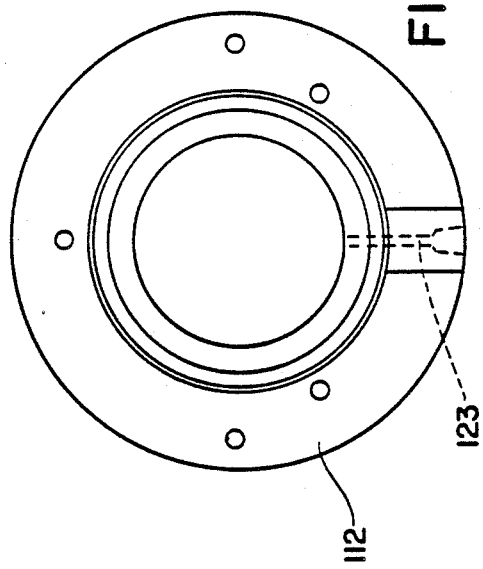

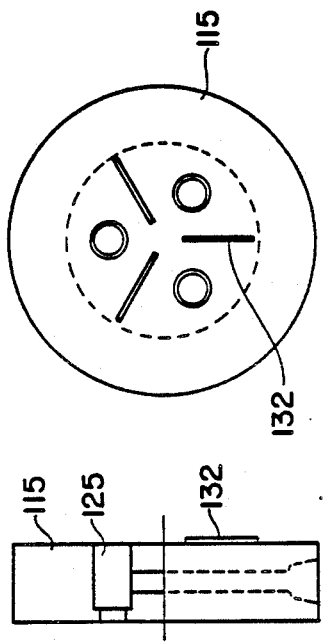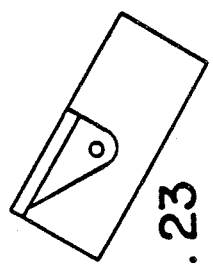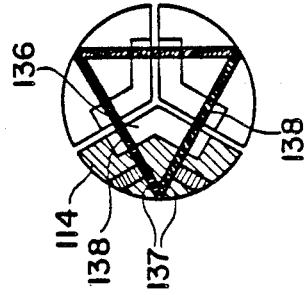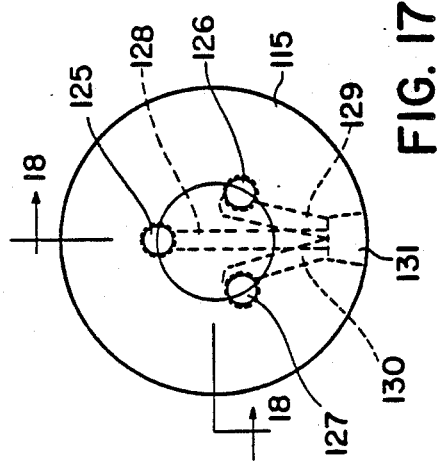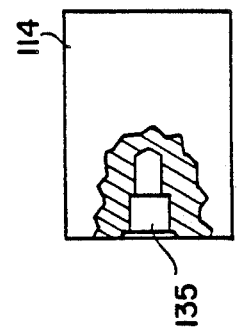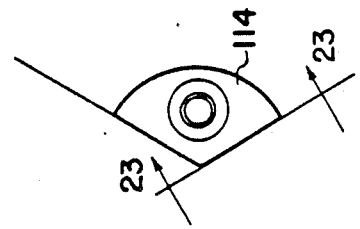

SYSTEM AND METHOD FOR VACUUM DEPOSITION OF THIN FILMS

This is a division, of co-pending application No. 935,292 filed Nov. 26, 1986 now U.S. Pat. No. 4,777,908.

FIELD OF THE INVENTION

This invention relates generally to vacuum deposition apparatus and methods and specifically to apparatus and methods for vacuum evaporation of thin film materials in a process which is called plasma plating.

BACKGROUND OF THE INVENTION

Prior Art

In a Siemens German published patent application No. 2,624,005 dated Dec. 8, 1977, a thin film deposition process called ion plating is described. In the process described in this application, an electron gun evaporation system is combined with a gas discharge system so that the evaporated material from the crucible and the ambient gas within the chamber are ionized in the region between the crucible and the substrate on which the material is being deposited. The arrangement of the apparatus shown in this prior art reference is depicted in FIG. 1 of the drawings. The structure and function of this apparatus is described below.

Vacuum chamber 1 is connected to a vacuum pump (not shown in the Figure). Inside the chamber is a water-cooled crucible 3 containing the material 4 with which the substrate is to be coated. The substrate 5 is attached to a substrate holder 6 which extends through an insulated bushing 7 and is connected to a high voltage source 8. Also located inside the chamber is an electron gun 9, which generates an electron beam 10 which is directed in a deflector system 11 towards the material 4. The deflector system 11 can be either a deflector capacitor or an electromagnet. The crucible 3 and the electron gun 9 may also form a single unit. The crucible 3 is connected to the positive terminal of the voltage source 8, possibly via a bushing 12; it may also be earthed.

For operation, the vessel is evacuated to a pressure of approximately 10−5. Then the electron gun 9 is put into operation and the material 4 in the crucible 3 is heated by means of the electron beam 10. When the high voltage source 8 is switched on, a gas discharge forms inside the vessel 1, the extent of which discharge is indicated by the broken line 13. The evaporated material 4 from the crucible 3 is ionized in the gas discharge in the space between the crucible and the substrate, so that ions 14 of the material 4 bombard the substrate. In order for the gas discharge to be able to form at low pressures of 10−5 torr, an additional device 15 producing ions, in the form of a high-frequency coil, is located in the space between the crucible 3 and the substrate 5, to which coil a high-frequency voltage source 16 is connected during the whole coating process.

The system described in the Siemens reference suffers from the following disdvantages:

(1) The use of a high d.c. voltage on the substrate holder limits the usefulness of the system to conductive substrates and conductive coating materials. Dielectric materials may possibly be coated but at low rates. Conditions at the substrate will change significantly as the insulating coating builds up. Even with conductive coatings there is a possibility that ion bombardment from a high applied voltage may cause atomic level damage to the substrate or film.

(2) The use of an r.f. coil to activate both the evaporant and the background gases also limits the versatility of the system. Activation of background gas and source material cannot be independently controlled and in fact, the low recommended background gas pressure of 10−5 Torr may seriously limit the number of gas ions which can be produced.

(3) The requirement for r.f. inside the chamber significantly complicates the coating process. In addition to coating more than d.c. systems, r.f. tends to cause arcing which can affect the quality of the films produced.

Buhl et al. U.S. Pat. No. 4,448,802, entitled METHOD AND APPARATUS FOR EVAPORATING MATERIAL UNDER VACUUM USING BOTH AN ARC DISCHARGE AND AN ELECTRON BEAM, issued on May 15, 1984 discloses several embodiments of systems which combine an electron gun evaporation system with a high current, low voltage source of electrons. In each of the embodiments shown in the Buhl et al. patent, definite geometric relationships between the high voltage electron beam and the low voltage electron beam are specified. These geometric relationships restrict the relative placement of these components of this system.

FIG. 2 of the drawings illustrates a version of the Buhl et al. system being offered commercially by Balzers Aktiengesellschaft of Lichtenstein as a commercially available coating chamber. In this case the coating chamber 21 is a special chamber with a low voltage, high current source 22 mounted in one side of the chamber, so that the low voltage electron beam 23 will part of its path to the crucible 24 in common with the path of the high voltage electron beam 25 emanating from the electron gun 26. A substrate rack 27 is not connected in a high voltage circuit, in contrast to the above-mentioned Siemens reference and instead the low voltage arc discharge is formed between the low voltage source 22 and the crucible 24.

In the apparatus shown in FIG. 2 and discussed in the Buhl '802 patent, the low voltage source 22 is arranged so that the magnetic field guiding the high voltage beam 25 also serves to guide the beam of electrons from the low voltage arc discharge 23. This restricts the geometric arrangement between the electron gun arrangement 26, the crucible 24, and the low voltage electron source 22. Inherent in these geometric restrictions is the requirement that the vacuum chamber 21 be specially designed for the incorporation of the low voltage electron source 22. This makes this technology less readily adaptable to standard vacuum coating chambers and makes it difficult to retrofit existing coating chambers with this new technology approach.

In the Buhl, et al. arrangement a reactive gas is injected directly into the vacuum chamber to be ionized in the low voltage arc discharge within the vacuum chamber.

SUMMARY OF THE INVENTION

Objects

It is the principle object of this invention to provide an improved system and method for combining a high voltage electron beam evaporation source arrangement with a low voltage, high current plasma source.

It is another object of this invention to provide a system for vacuum evaporation which combines a high voltage electron beam evaporation source and a low voltage, high current plasma source with substantial freedom in positioning of the low voltage plasma source relative to the crucible and high voltage electron beam source.

It is another object of this invention to provide an improved ion plating system in which the low voltage, high current plasam source can be readily retrofit to a standard coating chamber in which an electron beam evaporation source is already provided.

It is another object of this invention to provide a system for vacuum evaporation which combines a high voltage electron beam evaporation source and a low voltage, high current plasma source in such a way that evaporant material and additive gases are ionized in substantially independent plasmas, so that the relative degrees of ionization can be adjusted for optimum deposited film properties.

Features

One aspect of this invention features a system for vacuum evaporation of material onto a substrate with the system including a vacuum chamber, an arrangement for evacuating the chamber, and a substrate holder mounted within the chamber. A conductive source material container, such as a conductive crucible is positioned within the chamber and is electrically insulated therefrom but with a low electrical resistance connection therebetween. This crucible carries a preselected material therein for evaporation onto substrates on the substrate holder.

A high voltage electron beam source is positioned within the chamber in the vicinity of the crucible. This source includes high voltage electron gun and a deflection magnet system arranged for bending electrons from the gun into the crucible for evaporating the preselected material therein. The magnet system forms a magnetic field in the region above the crucible as part of the guiding of the high voltage electron beam into the crucible for evaporation purposes.

A low voltage, high current plasma source is positioned relative to the chamber to produce an intense primary plasma of a selected activation gas species for injection into the chamber at any convenient position relative to the crucible and the electron beam source. The low voltage plasma source is electrically interconnected with the crucible for current flow therebetween. The plasma source fills the chamber with a generally distributed plasma and the distributed plasma co-acts with the magnetic field above the crucible and evaporant material leaving the crucible to form an intense second plasma in the region above the crucible to ionize evaporant atoms. This activates the evaporant material passing through the plasma region toward the substrate. In the case in which the activation gas is reactive with the evaporant material, the deposited thin film has constituents of both the evaporant and the reactive gas species.

In both the cases of activated evaporation (no reaction between the additive gas species and the evaporant) and activated reactive evaporation (chemical reaction between the additive gas species and the evaporant) the deposited thin film has improved thin film characteristics. The nature of the improvements are discussed below.

Preferably the substrate holder is mounted in the top region of the chamber and the crucible and the high voltage electron gun are located in the bottom of the chamber. Preferably, for convenience of manufacture and use, the plasma source is also located adjacent to the bottom region of the chamber generally in a position on one side of the crucible and opposite to the electron gun. Although this is the preferred geometric arrangement between the components, it should be understood that in accordance with this invention, the low voltage plasma source is not restricted in its location relative to the high voltage electron gun and crucible.

In the system of this invention, it is preferable that the deflection magnet system for the high voltage electron source comprise a pair of magnet pole pieces arranged on opposite sides of the electron gun and shaped to provide a more narrow pole gap and accompanying higher magnetic field strength in the region of the electron gun whereat the electrons are emitted. A wider pole gap and accompanying lower magnetic field strength is provided in the region adjacent and above the crucible to increase the number of electrons that are withdrawn from the plasma to the crucible in the secondary plasma region. This increases the ionization efficiency in the secondary plasma region due to more low voltage electrons spiralling through the magnetic field before being collected on the crucible.

Another aspect of this invention involves an improved low voltage plasma source in which a first chamber is provided with a triangular arrangement of three separate filaments mounted therein with separate electrical biasing arrangements for heating the filaments along with an arrangement for communicating a noble gas into this first chamber for plasma activation by electrons from the heated filaments. A second chamber communicates with the first chamber through a small aperture and includes means for communicating the selected activation gas species into the second chamber and an electromagnet means surrounding the second chamber for creating a magnetic field therewithin to produce a plasma generating region within the second chamber. An intense plasma of the selected activation gas species is formed in the second chamber and is then communicated into the vacuum chamber to form a generally distributed plasma.

One of the main advantages of the system of this invention is that the low voltage plasma source can be mounted at the bottom wall of the vacuum chamber where it is convenient for servicing and where it is convenient to place it for retrofitting existing vacuum chambers to achieve the significant advantages of the plasma plating technology of this invention. The combination of the elimination of restrictive geometric relative position constraints as shown in the prior art systems also provides more effective operation of the plasma plating system.

By introducing the additive gas in the plasma generation region of the low voltage source, strong ionization of the selected gas species is provided. This ionization is decoupled from the ionization of the evaporant coming from the source crucible such that there is no defined arc discharge between the low voltage source and the crucible. The combination of tailoring the magnetic field from the deflection magnet system of the high voltage source with the creation of a generalized plasma in the chamber from the low voltage source permits high ionization potential to be achieved above the crucible for effective ionization of the evaporant species passing through this strong secondary plasma region. Between the intense primary plasma region and the intense secondary plasma region, the diffuse plasma provides the overall general electron current capability for the overall flow of current.

This invention also features a method for depositing thin film coatings which includes the steps of disposing a substrate in a vacuum chamber and disposing in the vacuum chamber a source of evaporant material within an electrically conducting container with line of sight from the material to the substrate. An intense plasma of a selected gas species is generated in at least one separate chamber in communication with the vacuum chamber to fill the vacuum chamber with a generally distributed plasma. The intense plasma and the container are coupled in an electrical circuit for current flow therebetween both through the distributed plasma within the vacuum chamber and directly through circuit connections outside the vacuum chamber.

A magnetic field of preconfigured characteristics is created in the region above the container. The source of evaporant material is heated to evaporate the same and thereby forms an intense second plasma region in the magnetic field above the container through which the evaporant material passes and is activated and then deposits on the substrate.

Other objects, features and advantages will be apparent from a consideration of the detailed description given below in conjunction with the accompanying drawings.

BRIEF DESCRIPTION OF THE DRAWING FIGURES

FIG. 11 is a partly sectioned view of a specific embodiment of a low voltage, high current plasma source useful in this invention.

FIGS. 12-23 are detail drawings of various components of the plasma source of FIG. 11.

DETAILED DESCRIPTION OF EMBODIMENTS

General Concepts of the Invention

Figure 1:
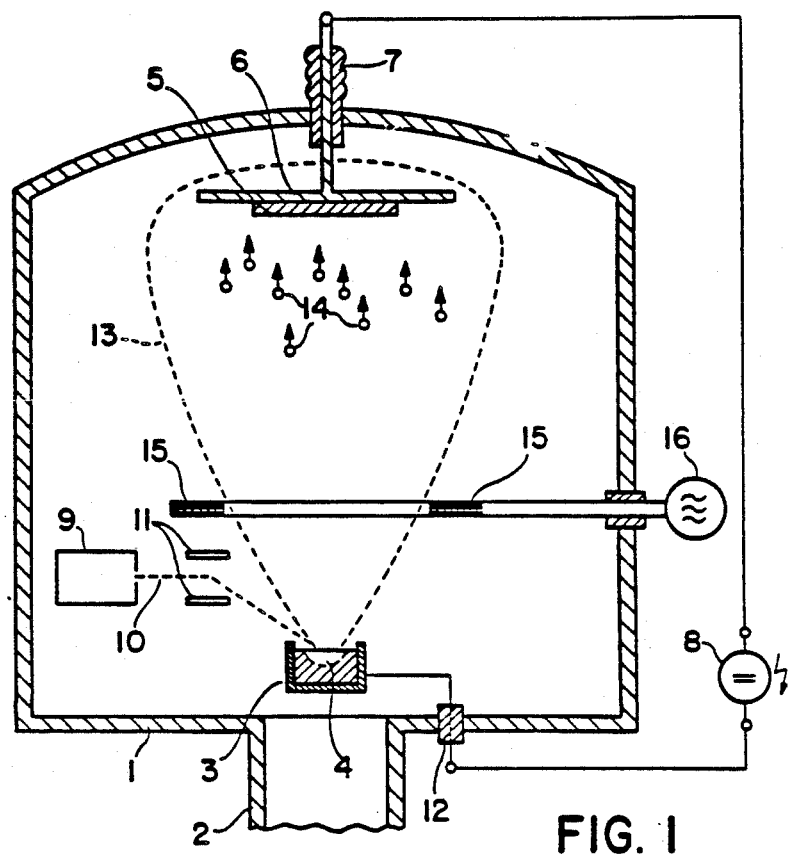
FIG. 1 is a schematic illustration of a prior art ion plating system.
Figure 2:
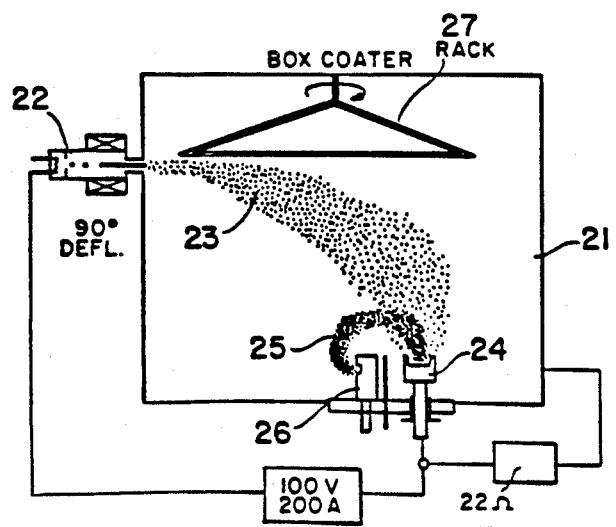
FIG. 2 is a schematic illustration of another prior art ion plating system.
Figure 3:
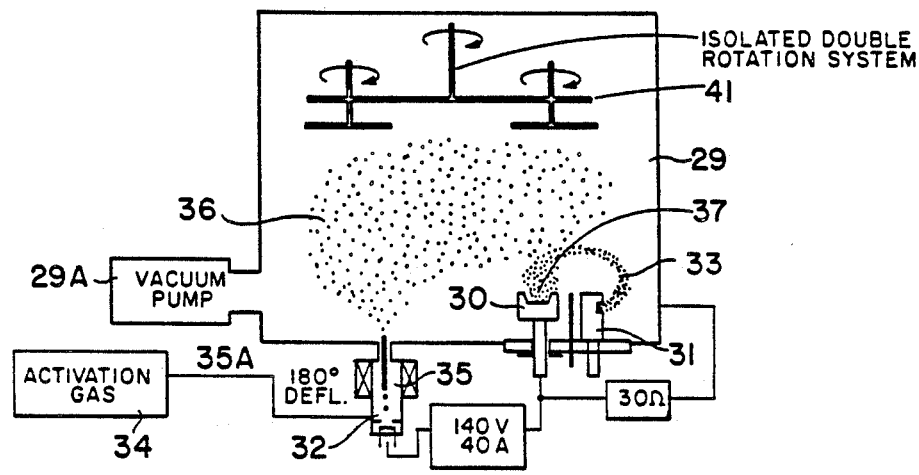
FIGS. 3-5 are schematic illustrations of embodiments of a plasma plating system and method of this invention.

FIG. 3 illustrates schematically the arrangement of crucible 30, high voltage electron beam gun 31 and low voltage plasma source 32 associated with a vacuum chamber 29 and vacuum pump 29A in accordance with this invention. Crucible 30 and high voltage electron gun arrangement 31 are mounted in the bottom of chamber 29 in an normal fashion. As will be described below, the crucible 30 is a special insulated, water-cooled rotating crucible which is preferred for implementation of this invention. FIG. 3 does not show the deflection magnet system for the high voltage electron beam 33, but this deflection magnet system is shown in other drawings and will be described below. Similarly, the biasing arrangement for the electron gun and the deflection magnet system are not shown. These are standard biasing arrangements and need not be disclosed herein.

The 270 degree deflection system shown in FIG. 3 is preferred, but the invention could also employ other deflection, systems such as a 90 degree deflection system.

The low voltage, high current source arrangemment 32 produces an intense plasma of a selected additive gas 34 (also called an activation gas) which is communicated into a plasma generating chamber region 35 associated with the low voltage source. The intense plasma in the plasma generating chamber region 35 is commuicated through port 35A and gradually communicates throughout the interior of the vacuum chamber 29, forming a general plasma distribution 36 within the vacuum chamber.

When the electron beam gun 31 is turned on and material begins to evaporate from the crucible 30, the electrical resistance in the region of 37 above the crucible gradually becomes lowered as the temperature increases and the evaporation rate from the crucible increases. The higher logicalized vapor pressure in the region 37 increases the ionization efficiency in that region. Furthermore, a portion of the magnetic field from the deflection system for the high voltage electron beam produces spiralling of the electrons from the generalized plasma 36 within the chamber toward the crucible 30 so that an intense second plasma is generated in the region 37 above the crucible. With the formation of this second plasma, the current between the crucible 30 and the low voltage source 32 increases by more than order of magnitude from two or three amperes to between twenty and one hundred amperes. However, even with this increase in current, there is no defined arc discharge path between the low voltage plasma source 32 and the crucible 30 through the general plasma region within the vacuum chamber 29.

Although the overall operation of a system of this type is difficult to describe accurately from a theoretical standpoint, it appears that the most likely explanation is that the low voltage plasma source 32 is decoupled from the secondary plasma region 37 through the generalized plasma cloud dispersed throughout the interior of the vacuum chamber 37. Electrons and activated gas molecules are ejected from the low voltage source 32 into the chamber to form the plasma cloud of electrons and ionized gas molecules. Then in the second plasma region 37, separate mechanisms are operating to withdraw electrons from the distributed plasma at a high rate through a region of low electrical resistance to create a high current flow.

Figure 4:
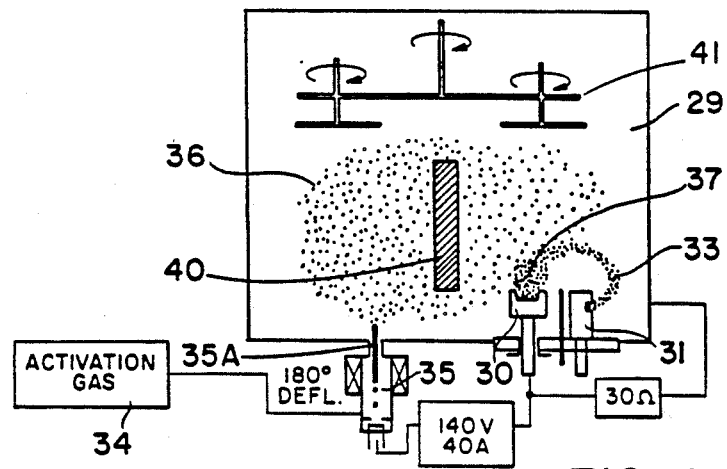

This theoretical operation of the system appears to be validated by the results of an experiment shown in FIG. 4 wherein a metal plate 40 was interposed between the low voltage source 32 and the crucible 30 which would block any defined electron beam from flowing therebetween if such a defined electron beam were present. With this metal plate in place, the system appears to operate essentially in the same manner as the system operates without the plate present. Accordingly, it appears that electrical conduction between the low voltage source 32 and the crucible 30 is a general plasma conduction that occurs throughout the distributed plasma rather than as a defined beam. Because of the absence of a defined beam, there is no requirement for guidance of the low voltage beam into the crucible. By appropriately tailoring the magnetic integral in the magnetic field above the crucible 30, high electron flow out of the generalized plasma region 36 into the crucible 30 is facilitated.

Figure 5:
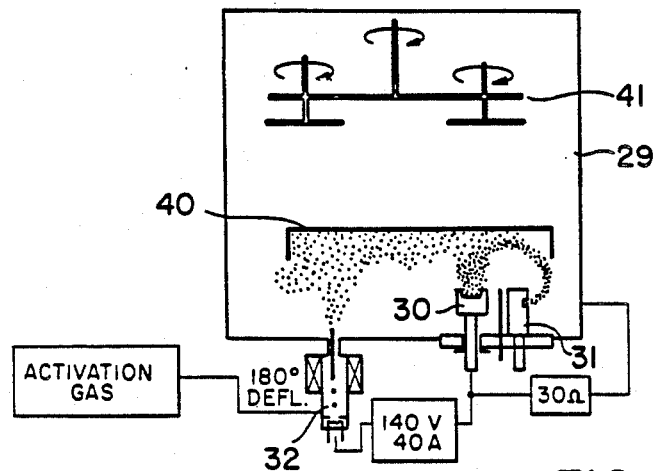

FIG. 5 illustrates that, utilizing the arrangement of this invention, a spatter shield 40 can be interposed in the vacuum chamber between the crucible 30 and substrate holder system 41 in order to confine the plasma and the evaporant species below this position of the spatter shield. This permits the overall evaporation process to be controlled from the standpoint of starting and stopping the actual evaporation onto substrates without turning off the electron beam gun 31 or the low voltage source 32.

Figure 25:
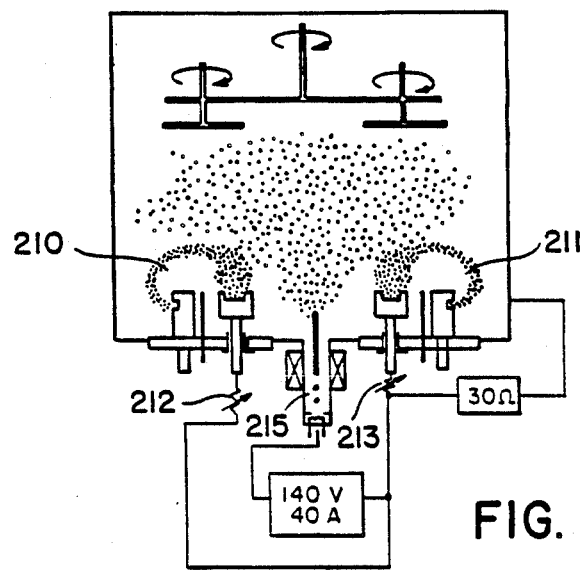
FIG. 25 is a schematic illustration of a two source embodiment of the system and method of this invention.

It should be understood that the this invention is not limited to the use of a single crucible and electron gun source. Instead, for producing multi-layer thin film coatings with alternating layers of different material on a substrate, a plurality of source crucibles and electron guns could be employed in a single evaporation system chamber. A double crucible and electron gun arrangement is shown in FIG. 25. In this arrangement, the source arrangements 210 and 211 can be operated sequentially to produce thin film layers of different materials on the substrate or the sources can be operated simultaneously to produce a mixture of the evaporant materials in a single thin film layer. This latter approach may be useful in forming cermet layers with one of the sources evaporating a metal and the other evaporating a dielectric material. Specifically, the dual source arrangement can be used to form mixed metal oxide layers using activated oxygen gas.

Variable resistors 212 and 213 may be optionally included in the circuits connecting the low voltage, high current plasma source 215 and the separate crucibles of the source arrangements. These resistors furnish a way of separately adjusting the current flow from the two separate second regions of plasma above the respective crucibles. When one electron gun is turned off, virtually all of the current will go to the crucible associated with the electron gun that is actually doing evaporation. Only small leakage current will flow in the other circuit. The variable resistors furnish an additional element of control (i.e. in addition to the e-beam current) to balance the ionization activation of evaporant from the two separate crucibles under simultaneous evaporation conditions.

The system of this invention like other ion plating systems in the prior art, can be employed to evaporate metal onto substrates to produce thin metal films without altering the chemical composition of the metal. In this case the additive gas is a gas species which does not react with the vaporized metal particles prior to deposition thereon on the substrate. The system and method of this invention may also be employed to form dielectic films on substrates within the chamber. In this case the source material is preferably the metal species or, where metal oxides are concerned, a partial oxidized source material and the activation gas would be selected to be oxygen for forming metal oxide films or nitrogen for forming metal nitride films.

For forming thin films such as sulphides and fluorides, it is preferable to use a resistance heated source. It is anticipated that the general plasma plating system and method of this invention will be adaptable to a resistance source embodiment by providing for conduction of current to the source such as by using a conductive metal lid with a pattern of holes for the evaporant to pass through. A magnetic field above the source container may be provided using a separate electromagnet structure in the vicinity of the source container.

The activated deposition process generally improves a number of film properties, including stoichiometry, density, refractive index and adhesion to the substrate. A theoretical basis for the improved thin film material characteristics is given in a paper presented by H. K. Pulker et al. entitled "Optical and Mechanical Properties of Ion Plated Oxide Films," published in the Proceedings of the 5th International Conference on Ion and Plasma Assisted Techniques, Munich, May 13–15, 1985, with a summary abstract published in the Journal of Vacuum Science and Technology, November/December 1985. This publication is hereby incorporated by reference. It is believed, however, that at present a consistent and complete theory for the improved thin film characteristics that are observed has not been developed. It is also believed that the system and method of this invention is even more effective than that of Pulker in producing desirable thin film properties.

System Operation

The operation of the system of this invention will now be discussed using FIG. 3 in conjunction with FIGS. 11 and 24. When the system is switched on, argon is bled into the filament cavity 95 and the additive gas (e.g. oxygen or other reactive gas or a non-reactive gas such as argon) is bled in above the aperture plate 111 through channel 122 and a gas distribution ring structure 122A. This gas distribution ring acts as a heat radiation shield to protect the O-ring seals in the aperture plate 111. It may also be used for fine tune the gas pressure near the aperture 98 based on the pumping speed of the vacuum coating machine.

The negative side of the bias supply 151 is connected to the filament current supply 152 and provides DC bias for the filament network 96. The positive side of the bias supply is connected to the e-beam gun crucible 30, through a 30-ohm dropping resistor to chamber ground, and through a incandescent light bulb 155 to the aperture plate as shown in FIG. 24. Since no current is being drawn, the chamber and the aperture plate are at bias potential relative to the filament.

The electron gun 31 is turned on to burn down the source material ready for evaporation. After burndown, the filament in the gun is turned down or off so that evaporation ceases, but the e-beam gun magnetic coil is left energized.

The low voltage electron source magnet 99 is energized by magnet supply 150 and the filament bias supply 151 turned up to heat the filaments 96. As the temperature of the filaments rises, electrons are emitted and an arc is struck from the filaments to the aperture plate. As shown in FIG. 24, it is preferable to connect an incandescent lamp between the aperture plate 111 (FIG. 11) and the circuit ground to conduct the initial current between the filaments and the aperture plate. This light bulb acts as a low resistance (virtually a dead short) during this plasma start up period. Once the arc has been struck and the current is flowing through the plasma, the resistance of the light bulb increases and drops the voltage between the filaments and the aperture plate.

The initial arc struck between the filaments and the aperture plate creates an intense plasma which acts as a source of electrons which can be drawn out through the aperture and which then spiral along the magnetic field of the low voltage source coil to the nearest anode. At this stage in startup, the nearest anode is usually chamber ground.

A plasma forms inside the low voltage source chamber 97 within the magnet coil and spreads out into the larger vacuum chamber, becoming more diffuse as the distance from the magnet coil increases. The magnet coil is powered typically with six amperes through 1000 turns, but the current is not critical and values in the range of four to fifteen amperes provide satisfactory operation.

The e-beam gun filament is then turned up so that evaporation of source material begins. As the flux of evaporant increases, some of it is ionized by the e-beam gun electrons and/or electrons from the chamber plasma. The result is the formation of a conductive plasma in the region 37 of the magnetic field above the e-beam gun crucible.

As this conductive plasma extends to the fringes of the magnetic field above the crucible, it presents to the chamber plasma an anode which is more accessible than the chamber walls. Bias current increases from about 1-3 amps before source material evaporation begins, to from 30-50 amps or more with evaporation taking place.

Under operating conditions there are, therefore, three distinct plasma regions. There is an intense plasma formed in the throat of the low voltage source which is formed of electrons plus ions of argon and of the gas introduced through this source. There is an intense plasma over the crucible which consists of electrons plus ionized source material plus a small percentage of ionized background gas. There is a fairly uniform plasma throughout the chamber which is approximately equipotential but which electrically connects the two intense plasmas.

Since all of the gas introduced into the chamber passes through the low voltage source chamber and all of the evaporant passes through the e-beam source plasma, there can be a very high degree of ionization of both species. The relative degree of ionization of a reactive gas and of the source material can be fine-tuned by changing the relative strengths of the two magnetic fields. However, the e-beam gun field requirement is also determined by the needs of the evaporation process. Once the e-beam gun design is fixed there may be little freedom in adjusting its magnetic field. Relative strengths of the two fields can be changed by adjusting the low voltage electron source magnet and by changing the bias voltage if required to maintain total bias current. It is believed that the intense gas plasma at the low voltage source and the ability to fine-tune the two intense plasmas account for the improved film properties seen with this system, compared with results reported by Pulker.

It should be understood that the above sequence of operations during startup is for explanation purposes. The sequence may be varied without affecting equilibrium conditions.

Preferred System Components

Having described the general structural and functional arrangements of the system and method of this invention, a detailed discussion of a presently preferred embodiment of the system and specifically preferred system components will now be given.

Electron Gun and Rotating Crucible

Figure 8:
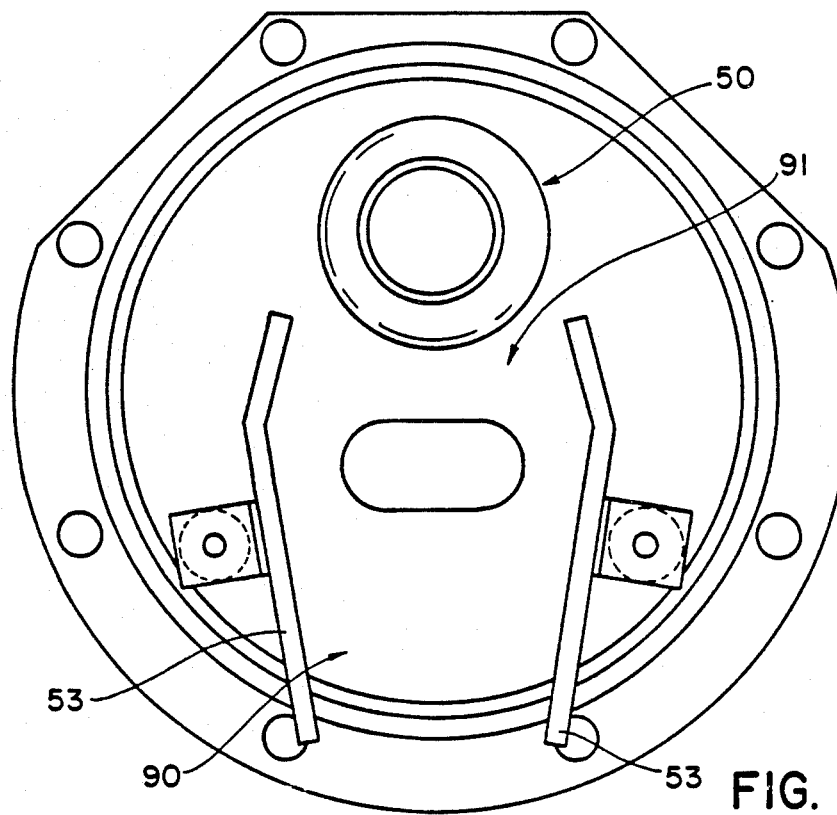
FIGS. 6-8 are illustrations of and electron beam gun and rotating crucible arrangement useful in the system and method of this invention.
Figure 6:
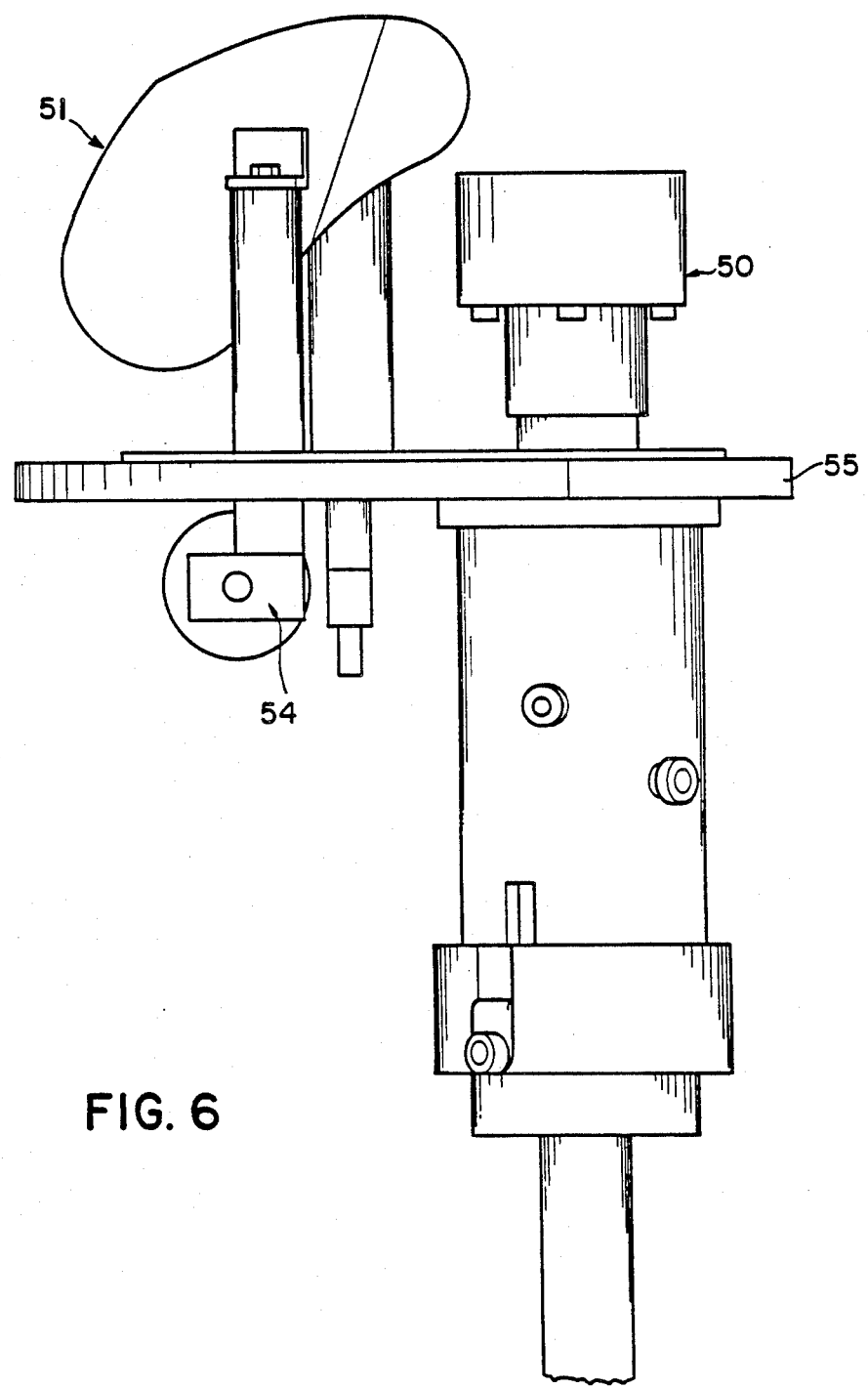
Figure 7:
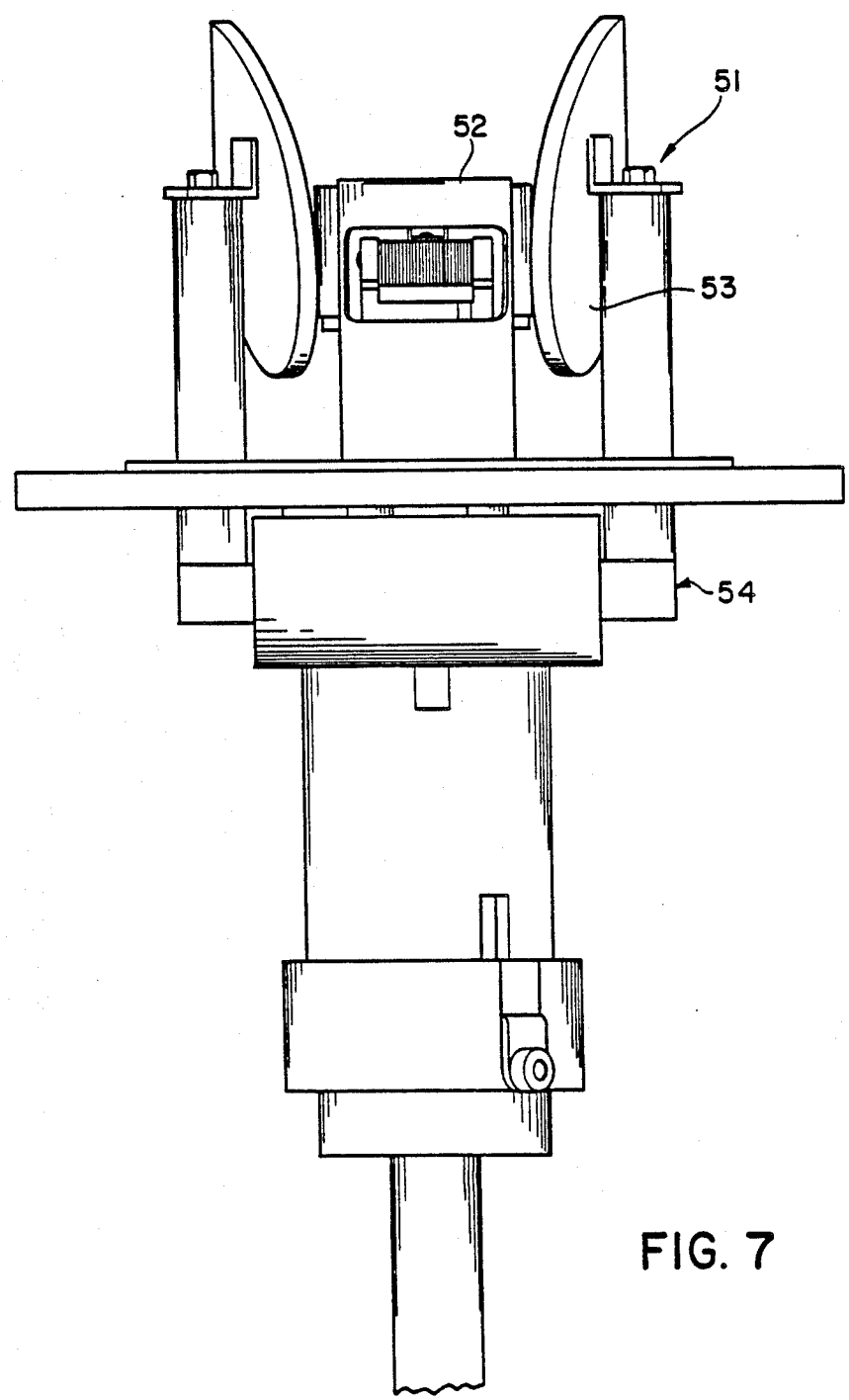

FIGS. 6, 7 and 8 illustrate the preferred subassembly for a rotating crucible arrangement 50 and a 270 degree deflection electron beam arrangement 51. The high voltage electron beam arrangement 51 is basically a conventional system which utilizes an electron gun 52 and a pair of magnetic pole pieces 53, together with a magnet coil and magnet circuit arrangement 54 which provides a magnetic field of substantial intensity between the pole pieces 53. However, although the overall arrangement is conventional, the shape of the pole pieces 51 and thier orientation in space relative to the electron gun 52 and the region above the crucible 50 is specially tailored to this application for purposes which have been discussed above and will be described in more detail below.

The electron gun arrangement 51 and the rotating crucible arrangement 50 are mounted on a common base 55 which in turn mounts to the bottom of a vacuum chamber in a conventional fashion. Appropriate vacuum sealing rings are provided on the base plate 55. The entire assembly is easily removed from the vacuum chamber in order to clean the system.

Figure 9:
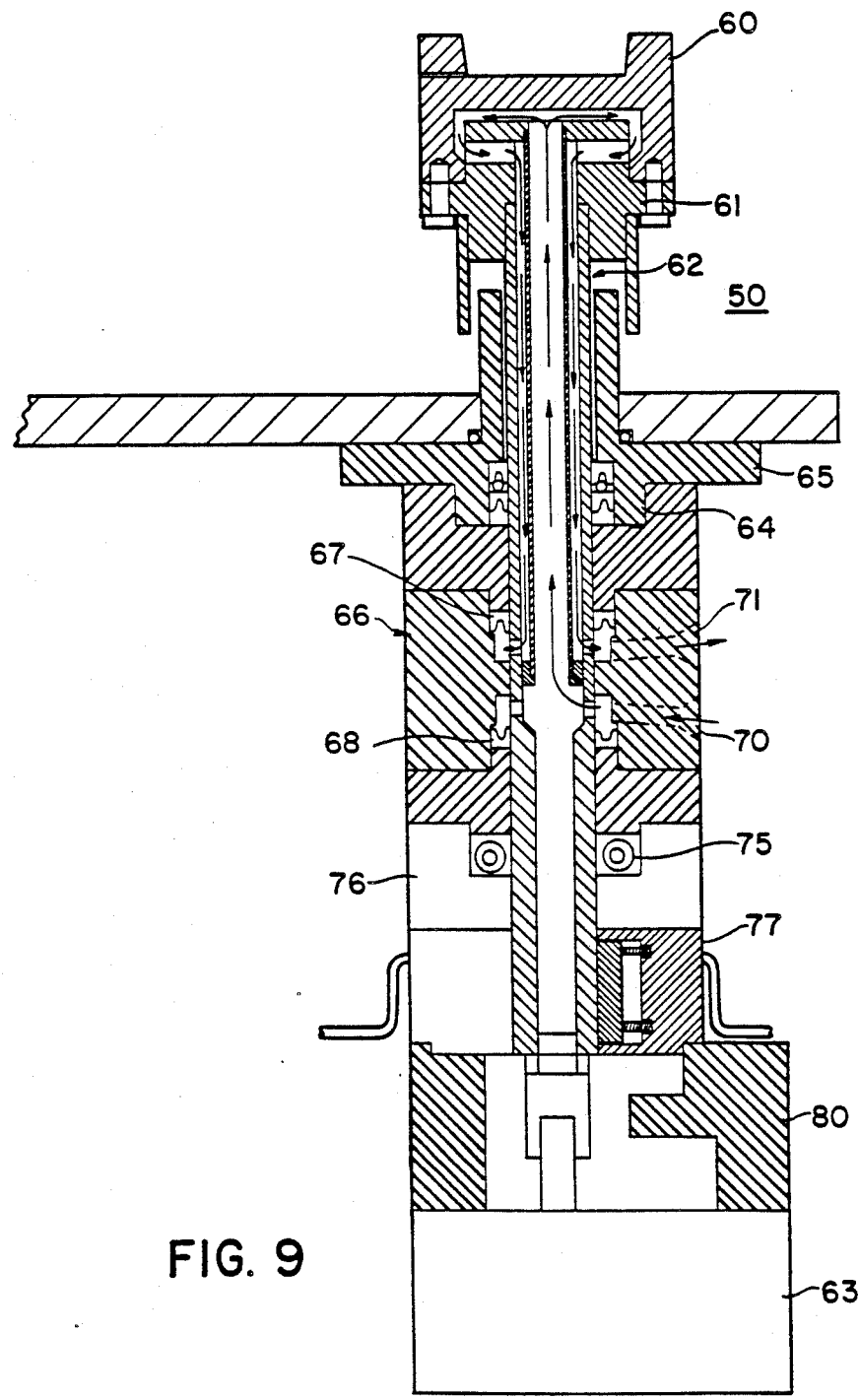
FIG. 9 is a section view of a rotating crucible arrangement useful in this invention.

The structural and functional details of the rotating water-cooled crucible assembly 50 are shown in FIG. 9. A copper crucible 60 is mounted on top of a platform 61 which is carried on a rotating hollow concentric shaft arrangement 62 which is driven by an electric motor 63. A vacuum sealing gland arrangement 64 provides a vacuum seal between the rotating shaft arrangement 62 and the mounting flange 65 which in turn mounts to the overall base 55 of the crucible and electron gun assembly shown in FIGS. 6-8. A water gland arrangement 66 includes a pair of U-cup water sealing elements 67 and 68 surrounding the shaft assembly 62. A water inlet 72 and a water outlet 71 respectively communicate with water flow channels within the concentric hollow shaft arrangement 62 to provide a stream of cooling water to the copper crucible 60 as shown.

The shaft assembly 62 is journaled for rotation in a split clamp thrust bearing 75 which fits within a recess in a brush holder assembly 76 which surrounds the outside of the shaft and holds a plurality of brush assemblies 77 in close electrical contact with the exterior of the shaft arrangement 62. In this manner good electrical conductivity between the copper crucible and the plurality of brush assembly 77 is provided. Two or four brush assemblies each containing spring loaded carbon brushes may be provided to conduct the electrical current which flows through the copper crucible and the shaft during operation of the system.

A drive motor mount arrangement 80 mounts the drive motor 63 underneath the brush holder assembly 76.

Referring now to FIG. 8 it can be seen that the pole pieces 53 are configured and mounted such that the spacing between the pole pieces is less in the deflection region 90 of the high voltage electron beam so that most of the steering of the beam occurs prior to the beam reaching the point where it leaves the influence of the magnetic field adjacent to crucible 50. In this manner, the beam enters the crucible at a fairly steep angle and it is for this reason that the crucible is rotated so that the beam will strike all portions of the source located within the crucible. The stronger magnetic field in the region 90 contrasts with a substantially reduced magnetic field in the region above the crucible 50. Although the pole pieces 53 do not extend over the crucible 50, it will be appreciated that there is a fringe magnetic field above the region of the crucible which tends to continue to bend the electron beam into the crucible. This fringe field also tends to affect the electrons which are being withdrawn from the generalized plasma into the crucible.

By the arrangement of the pole pieces 53 shown in FIG. 8, the magnetic integral of the magnetic field which exists over the crucible is such that the low voltage electrons from the generalized plasma can readily penetrate into the crucible. These electrons will traverse a spiral path through the magnetic field creating a high ionization efficiency in the region over the crucible. It has been shown necessary to reduce the magnetic field strength in the region 91 between the ends of the pole pieces which are adjacent to crucible to about one-third that of the field strength at the other end of the pole pieces in order to have efficient collection of the electrons from the plasma into the crucible to produce the intense secondary plasma above the crucible.

Low Voltage Plasma Source

Figure 10:
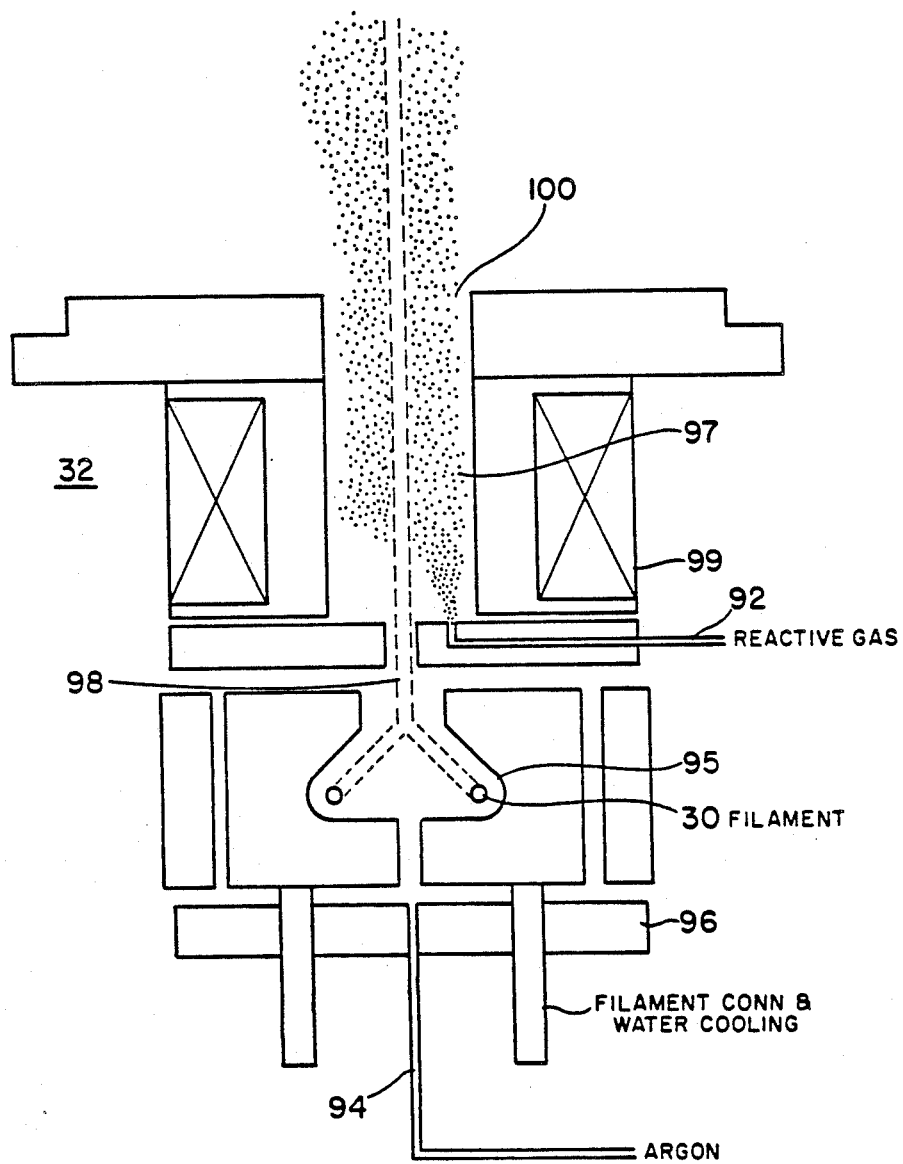
FIG. 10 is a schematic illustration of a low voltage, high current plasma source useful in this invention.

Referring now to FIG. 10, the general schematic arrangement of components of the low voltage plasma source will be discussed. The details of this arrangement will be described in conjunction with other drawing figures which show in more detail the mechanical arrangements of this low voltage source 32. From a general standpoint, the construction and arrangement of this low voltage source corresponds to the Van Cakenburghe source which is disclosed in published European patent application No. 82.103.729.8 dated Apr. 30, 1982. There are however some differences in detail of the specific version of the source 32 used in a preferred embodiment of this invention which provides certain operating improvements for the preferred embodiment.

Generally, the Van Cakenburghe type souce 32 includes a first chamber 95 in which a filament arrangement 96 is positioned. A gas supply arrangement 94 is provided for communicating a noble gas such as argon into the chamber 95 to create a sufficient gas pressure so that the electrons from the heated filament can induce an arc discharge within the chamber. A second chamber 97 communicates with the first chamber 95 through an aperture 98. The argon plasma created in the chamber 95 due to the arc discharge is communicated into the second chamber 97. An arrangement 92 is provided for bleeding an additive gas, e.g. a reactive gas such as oxygen into the second chamber 97. Magnet coil 99 serves to produce a magnetic field within the plasma creation chamber 95 and the plasma generating chamber 97 which tends to provide a substantial amount of plasma confinement in the chamber 97 to form an intense primary plasma in that region. However, because of the opening 100 to the vacuum chamber interior, this intense plasma gradually migrates into the entire vacuum chamber as discussed above.

Because of the intense heat that is generated in all areas of this low voltage source, water cooling channels are provided for the filament connecting blocks, for the wall between the chambers 95 and 97 as well as cooling coils formed around the focus magnet coils 99.

Referring now to FIG. 11, the specific structural details of a preferred embodiment of Van Cakenburghe type source 32 modified for improved performance in the system and method of this invention will be described. The magnet coil 99 is wound on a separate bobbin which fits over the metal cylindrical portion 110 which defines the second chamber 97. A cooled aperture plate 111 and an emitter support ring 112 are held to the bottom wall of the second chamber 97 utilizing a plurality of plastic mounting dogs 113. A plurality of filament support blocks 114 are positioned within the emitter support ring and supported on an emitter insulating block 115 which is held in position on the emitter support ring by a plurality of plastic mounting dogs 116.

A pair of nylon insulating spacers 117 and 118 are positioned between the aperture flange 111 and the bottom wall of the chamber 97 and the top portion of the emitter support ring 112.

The details of the aperture flange are shown in FIGS. 12, 13 and 14. FIGS. 12, 13 and 14 illustrate the aperture plate 113 which is preferably formed from a high heat conducting material such as copper with a tungsten aperture insert 120. Water cooling channels 121 are preferably formed in the body of the aperture plate so that cooling water can be circulated through the plate to maintain the temperature below the melting point of the materials.

A gas bleed chamber 122 is formed between one side wall of the aperture plate and the top of the aperture plate in order to bleed oxygen or other selected additive gases into the plasma chamber 97 shown in FIG. 11. FIGS. 15 and 16 illustrate the emitter support ring 112 which has an argon gas feed channel 123 formed therein which bleeds the argon gas into the chamber 95. FIGS. 17, 18 and 19 illustrate the emitter insulation block 115. Three apertures 125, 126 and 127 extend through the emitter insulation block and are adapted to receive a stainless steel tube (119, FIG. 11) which extends through each aperture into the associated one of the three separate emitter blocks to communicate cooling water to each of the emitter blocks. The stainless steel tube extends through the emitter insulating block up into a drilled recess in the emitter block as shown in FIG. 11. A series of apertures permit the water to pass then into a coaxial channel on the outside of the copper tube to be collected in a series of outlet water channels 128, 129 and 130 leading to a common water outlet port 131. Three equally spaced emitter block guides 132 extend above the top surface of the emitter insulating block to serve as position location guides for the three emitter blocks which sit on top of the emitter insulation block.

FIGS. 20–23 illustrate the structural details of the emitter blocks 114 which support the filaments. Each of the emitter blocks 114 has a recess 135 formed in the bottom portion thereof to receive cooling water as previously described. A recessed region 136 formed in the front face of each of the emitter blocks 114 together provides the chamber 95 in which the initial plasma is generated. A set of apertures 137 receive the ends of filaments 138 with associated set screw mounting arrangements as shown. Voltages are supplied to the emitter blocks through the stainless steel water tube 119 shown in FIG. 11 by placing an electrical supply clamp 119A thereon as shown in FIG. 11.

Figure 24:
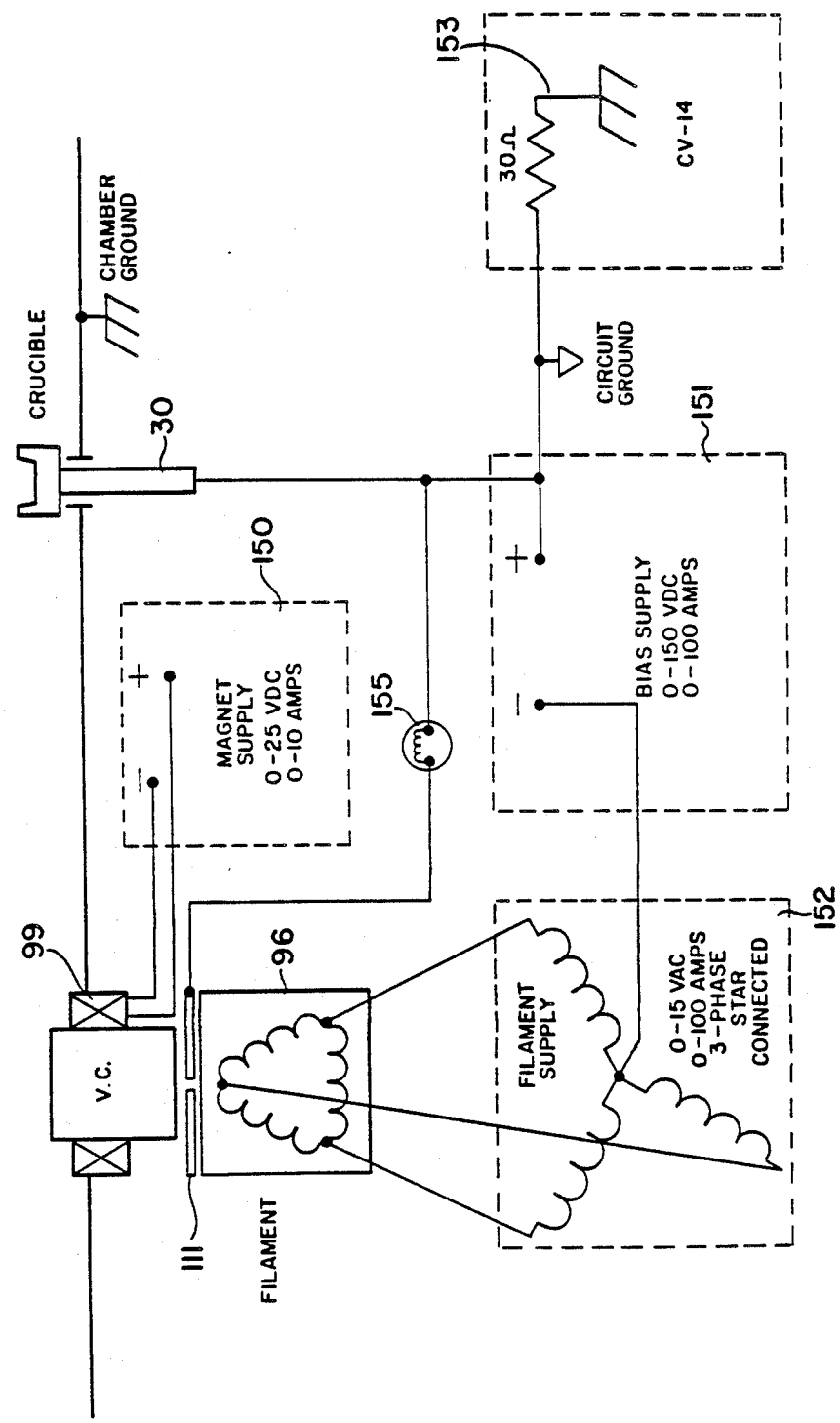
FIG. 24 is circuit schematic diagram of the power supplies and electrical connections of a system in accordance with this invention.

FIG. 24 illustrates the electrical circuit supply to the low voltage plasma source. The focus magnet 99 of the low voltage plasma source is coupled to a direct current magnet supply 150 so that the focus electromagnet 99 produces a magnetic field of controllable strength in both the first plasma region 95 shown in FIG. 11 and the second plasma region 97. Two separate power supplies 151 and 152 are coupled between the crucible 30 and the triangular filament arrangement 96. The basic bias supply 151 supplies high current at low voltage to the filament supply 152 to bias the overall filament 96 relative to the crucible 30. The filament supply 152 is a three phase star connected supply which separately produces high current through the filaments for resistance heating thereof. The bias supply 151 has its positive terminal connected to circuit ground and a 30 ohm resistor 153 is coupled between the chamber and the circuit ground.

Specific System Embodiment and Examples

To demonstrate the effectiveness and results of this invention, an experimental version of an ion plating type of coating system has been constructed. The dimensions and operating characteristics of the chamber and its various components were as follows:

The experimental ion plating system was installed in a typical diffusion pumped 30×30×40 inch high box coater system arranged as in FIG. 3, but using a single rotation rack with a 32 inch coating distance. It was equipped with a cold cathode vacuum gauge, a quartz crystal coating monitor, piezoelectric servo controller for the reactive gas, and the appropriate power supplies for the plasma plating equipment under test. All gases pass through mass flow controlling/readout devices which allow the amount of gas used in the process to be monitored and optionally controlled.

The argon shielding gas communicated into the filament chamber of the low voltae source is controlled and monitored by this type of device. The term shielding gas is used because the function of this gas in the filament chamber is to shield the filament from additive gases such as oxygen which are communicated into the plasma generating chamber adjacent the filament chamber. The flow of shielding gas such as argon is maintained at a constant level to maintain a higher pressure in the filament chamber than in the adjacent plasma generating chamber. The filament life is extended by avoiding the erosion that would occur if it were exposed to a relative gas such as oxygen.

Figure 26:
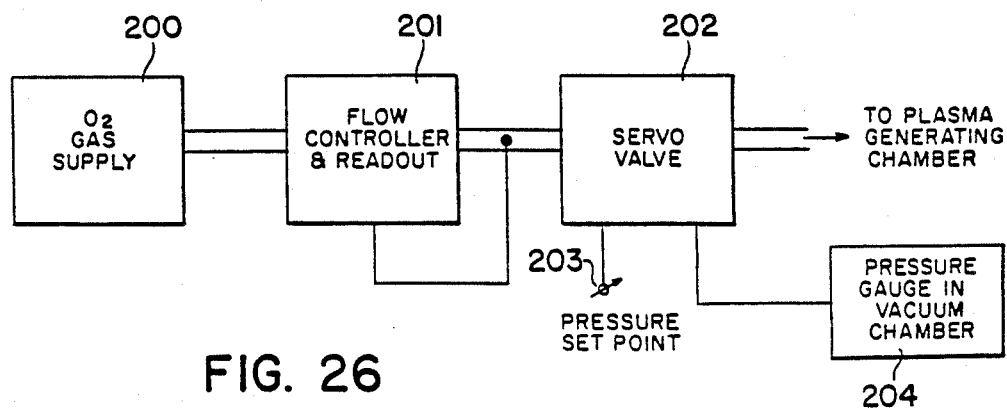
FIG. 26 is a schematic illustration of a gas flow control and measuring arrangement useful in the system and method of this invention.

The relative gas flow or additive gas flow is monitored by this flow controlling and reading device but is controlled by a servo control valve as shown in FIG. 26 for the case of a reactive oxygen gas flow. The oxygen gas supply 200 communicates the flow of oxygen through the flow controller and readout 201 which is set at full open so that it functions only as a readout of the gas flowing therethrough. The servo valve 202 actually controls the flow of oxygen. An oxygen partial pressure set point control 203 together with the pressure gage 204 which measures the percent oxygen in the vacuum chamber control the servo valve to maintain the partial pressure of oxygen in the chamber at a constant preset value. If a different additive gas is used, the control approach would be essentially the same.

The amount of the reactive gas or additive gas used is therefore a function of the pumping speed of the machine and the gettering of the gas by the evaporant. There is a broad band of usable parameter space. Table I below lists some representative values which can be used and the typical indices of refraction of the resulting films. All of the runs corresponding to the data in Table I were started at room temperature, about 72, and ended up at an elevated temperature due to the heat added by the process. Since there is no evidence of inhomogeneity in the deposited films, it is believed that heat is not an important process variable.

From the results given in the examples in Table I, it can be seen that the quality of the oxide films that are formed on a substrate utilizing the plasma plating system and method of this invention are superior to those which are formed with conventional vacuum evaporation processes. The characteristics of the deposited thin films are at least as good as, and it some cases better than those reported in the Pulker et al publication.

While this invention has been described in terms of a specific embodiment and various examples, it should be understood that numerous changes in detail in the implementation of the invention could be made by persons of skill in this art without departing from the principles of the invention as set forth in the attached claims.

TABLE I

OPERATING EXAMPLES

| Final Coating Composition | $TiO_2$ | $TiO_2$ | $Ta_2O_5$ | $Al_2O_3$ | $SiO_2$ |
| --- | --- | --- | --- | --- | --- |
| Starting evaporant material | TiO | Ti | $TaO_c$ | $Al$ | Si |
| Electron gun voltage in kilovolts (kV) | 6 | 6 | 7.5 | 6 | 6 |
| Electron gun current in amperes (A) | .59 | .45 | .57 | .44 | .56 |
| Electron gun focus current in amperes (A) | 1.1 | 1.1 | .8 | .7 | .75 |
| Chamber starting temp. | 72° F. | 72° F. | 72° F. | 72° F. | 72° F. |
| Bias voltage (V) | 109 | 118 | 102 | 90 | 112 |
| Bias current (A) | 60 | 50 | 70 | 40 | 40 |
| Oxygen flow (sccm) | 170 | 150 | 90 | 300 | 350 |
| Argon flow (sccm) | 10 | 10 | 10 | 10 | 10 |
| Chamber pressure (Torr) | $1 \times 10^{-3}$ | $5 \times 10^{-4}$ | $1 \times 10^{-3}$ | $1 \times 10^{-3}$ | $1 \times 10^{-3}$ |
| Coating rate (minutes/QWOT @ 550 nm) | .66 | 1.5 | 2.0 | 1.73 | 2.0 |
| Refractive Indices | | | | | |
| @ 450 nm | 2.70 | | 2.32 | 1.71 | 1.495 |
| @ 500 nm | 2.65 | | 2.31 | 1.70 | 1.495 |
| @ 550 nm | 2.62 | | 2.30 | 1.69 | 1.49 |
| @ 700 nm | 2.54 | | 2.30 | 1.68 | 1.49 |
| Conventional Evaporation @ 550 | 2.32 | | 2.24 | | 1.45 |

What is claimed is:

1. In a method for depositing thin film coatings, the steps of:
   disposing a substrate in a vacuum chamber;
   disposing in said vacuum chamber at least a first source of evaporant material within an electrically conducting container with line of sight from said material to said substrate;
   generating an intense plasma of a selected activation gas species in at least one separate chamber in communication with said vacuum chamber to fill said vacuum chamber with a generally distributed plasma;
   coupling said intense plasma and said container in an electrical circuit for current flow therebetween both through said distributed plasma within said chamber and directly through circuit connections outside said chamber;

creating a magnetic field of preconfigured characteristics in the region above said container;

heating said source of evaporant material to evaporate the same and thereby forming an intense second plasma region in said magnetic field above said container through which said evaporant material passes and is activated and then deposits on said substrate.

2. In a method for reactive deposition of thin film coatings, the steps of:

disposing a substrate in a vacuum chamber;

disposing in said vacuum chamber at least a first electrically conductive container with a source of evaporant material therein having line of sight to said substrate;

generating an intense plasma of a selected reactive activation gas species in at least one separate chamber in communication with said vacuum chamber to fill said vacuum chamber with a generally distributed plasma of said reactive activation gas species;

coupling said intense plasma and said container in an electrical circuit for current flow therebetween both through said distributed plasma within said chamber and directly through circuit connections outside said chamber;

creating a magnetic field of preconfigured characteristics in the region above said container; and heating said source of evaporant material to evaporate the same and thereby to create an intense second plasma region above said container through which said evaporant material passes and is activated on its way to said substrate where it combines with said reactive activation gas species and deposits on said substrate as a thin film.

3. The method any of claims 1 or 2, wherein the selected gas species is reactive with the evaporant material, and the thin film deposited on the substrate thereby includes a chemical combination of the evaporant material and the selected activation gas species.

4. The method any of claims 1 or 2, wherein the substrate is disposed in a top region of the vacuum chamber, the container for the source evaporant material is disposed in a bottom region of the vacuum chamber, the heating of the source of evaporant material is by a high voltage electron gun positioned in a bottom region of the vacuum chamber and the separate chamber for generating the intense plasma is in communication with the vacuum chamber at a bottom region of the vacuum chamber generally in a position on one side of the container opposite the electron gun.

5. The method any of claims 1 or 2, further comprising disposing in the vacuum chamber first and second containers for first and second sources of evaporant materials and providing first and second high voltage electron-beam guns for heating the respective first and second sources of evaporant materials, wherein the first and second evaporant materials are chemically different materials, and further comprising the steps of operating the first and second electron beam guns during separate first and second time periods such that the thin film deposited during the first time period comprises the first material and the thin film deposited during the second time period comprises the second material.

6. The method of claim 5, wherein the substrate is disposed in the top region of the vacuum chamber, the containers for evaporant material are disposed in the bottom of the vacuum chamber, as are the associated electron beam guns and the separate chamber for generating the intense plasma is in communication with the vacuum chamber at a bottom region of the vacuum chamber generally in a position between the two containers opposite the associated electron guns.

7. The method any of claims 1 or 2, further comprising disposing in the vacuum chamber first and second sources, respectively, of first and second evaporant materials and providing first and second high voltage electron beam guns for heating the respective first and second sources of evaporant materials, wherein the first and second evaporant materials are chemically different materials, and further comprising the steps of operating the first and second electron beam guns during the same time period such that the thin film deposited on the substrate comprises both the first and second materials.

8. The method of claim 7, wherein the substrate is disposed in the top region of the vacuum chamber, the containers for evaporant material are disposed in the bottom of the vacuum chamber, as are the associated electron beam guns and the separate chamber for generating the intense plasma is in communication with the vacuum chamber at a bottom region of the vacuum chamber generally in a position between the two containers opposite the associated electron guns.

9. The method of claim 1, wherein the source of evaporant material is heated by an electron beam and wherein said preconfigured magnetic field is configured to focus the electron beam onto the source of evaporant material in addition to enabling said intense second plasma region.

10. The method of claim 2, wherein the source of evaporant material is heated by an electron beam and wherein said preconfigured magnetic field is configured to focus the electron beam onto the source of evaporant material in addition to enabling said intense second plasma region.

* * * * *